(12) United States Patent
Kim et al.

(10) Patent No.: US 9,081,272 B2
(45) Date of Patent: Jul. 14, 2015

(54) LEVELING APPARATUS AND ATOMIC FORCE MICROSCOPE INCLUDING THE SAME

(71) Applicant: Park Systems Corp., Suwon-si (KR)

(72) Inventors: Suk Hyun Kim, Seoul (KR); Han Aul Noh, Suwon-Si (KR); Ah Jin Jo, Seoul (KR)

(73) Assignee: Park Systems Corp., Suwon-si (KR)

( * ) Notice: Subject to any disclaimer, the term of this patent is extended or adjusted under 35 U.S.C. 154(b) by 0 days.

(21) Appl. No.: 14/243,728

(22) Filed: Apr. 2, 2014

(65) Prior Publication Data

US 2014/0304861 A1    Oct. 9, 2014

(30) Foreign Application Priority Data

Apr. 3, 2013    (KR) .................. 10-2013-0036524

(51) Int. Cl.
| | |
|---|---|
| G03F 7/00 | (2006.01) |
| B82Y 10/00 | (2011.01) |
| G01Q 70/02 | (2010.01) |
| G01Q 70/06 | (2010.01) |
| G01Q 80/00 | (2010.01) |

(52) U.S. Cl.
CPC ............ *G03F 7/0002* (2013.01); *B82Y 10/00* (2013.01); *G01Q 70/02* (2013.01); *G01Q 70/06* (2013.01); *G01Q 80/00* (2013.01)

(58) Field of Classification Search
USPC .............................. 850/19; 118/663; 414/816
See application file for complete search history.

(56) References Cited

U.S. PATENT DOCUMENTS

| | | | | |
|---|---|---|---|---|
| 2011/0165329 | A1* | 7/2011 | Mirkin et al. | ................. 427/256 |
| 2011/0268882 | A1* | 11/2011 | Bussan et al. | ................. 427/256 |
| 2011/0268883 | A1* | 11/2011 | Haaheim et al. | ............... 427/256 |
| 2014/0336071 | A1* | 11/2014 | Salaita et al. | ..................... 506/9 |

* cited by examiner

*Primary Examiner* — Phillip A Johnston
*Assistant Examiner* — Hsien Tsai (57) ABSTRACT

The present invention relates to a leveling apparatus that levels an object to be leveled with a surface of a substrate by measuring the force applied to the object, and an atomic force microscope including the leveling apparatus.

A leveling apparatus according to the present invention, which levels an object with a substrate such that one side of the object is brought in parallel contact with the surface of the substrate, includes: force sensors disposed to measure force at at least three points on the other side of the object; an angle adjusting unit disposed to adjust the angle between the object and the surface of the substrate; and a controller connecting with the force sensors and the angle adjusting unit to drive the angle adjusting unit on the basis of data from the force sensors. The controller obtains the data on force applied to the force sensors by bringing one side of the object in contact with the surface of the substrate at a predetermined angle, calculates the degree of relative inclination between the object and the surface of the substrate from the data on force, and levels the object with the surface of the substrate by adjusting the angle of the object or the substrate with the angle adjusting unit on the basis of the degree of relative inclination.

8 Claims, 7 Drawing Sheets

LEVELING APPARATUS AND ATOMIC FORCE MICROSCOPE INCLUDING THE SAME

CROSS-REFERENCE TO RELATED APPLICATIONS

This application claims the priority of Korean Patent Application No. 2013-0036524 filed on Apr. 3, 2013, in the Korean Intellectual Property Office, the disclosure of which is incorporated herein by reference.

BACKGROUND OF THE INVENTION

1. Field of the Invention

The present invention relates to a leveling apparatus and an atomic force microscope including the same, and more particularly, to a leveling apparatus that levels a leveling object with a surface of a substrate by directly measuring a force applied to the leveling object, and an atomic force microscope including the leveling apparatus.

2. Description of the Related Art

Lithography is used in various fields of science and technology including production of an integrated circuit, a storage, a video screen, an MEMS (microelectromechanical systems), a down-sized sensor, a microfluidic system, a biochip, a photonic bandgap structure, and a diffractive optical element, and recently, dip-pen nanolithography and polymer pen lithography have been developed.

Dip-pen nanolithography (DPN) that enables the tip of a cantilever of an AFM (Atomic Force Microscope) to function as a pen, covers the tip with a chemical compound or a mixture that function as ink, and then brings the tip in contact with a substrate, has been developed by the research team of Chad Mirkin at Northwestern University.

Thereafter, F. Huo et al. at Northwestern University have developed PPL (Polymer Pen Lithography) that allows for printing points of 90 nm to hundreds of micrometers (μm) quickly at a low cost, using a PPA (Polymer Pen Array) manufactured by the conventional photolithography and chemical wet etching in the related art.

The DPN and PPL, direct-write nanolithographic approaches, are expected to high throughput, multiplexing, and productivity and can be used for various purposes, so recently they have been actively studied.

In the DPN and the PPL, an array with tips or polymer pens arranged on a one-dimensional line or a two-dimensional plane is used in most cases, but the more the number of the tips or the polymer pens in the array increases or the more the array is complicated, the more it is difficult to bring the array horizontally in contact with the surface of a substrate. If the array is not horizontally on the surface of a substrate, one tip or one polymer pen is brought first in contact with the surface of the substrate before another tip or polymer pen is brought in contact with the surface of the substrate, such that there are left tips or polymer pens that were not brought in contact with the surface.

When there are tips or polymer pens that were not brought in contact with the surface of the substrate, desired lithography cannot be made on the substrate and the tips or polymer pens brought first in contact with the surface are easy to be damaged by excessive pressure. Accordingly, the array requires high degree of flatness and it is important to level the array arranged with tips or polymer pens with the surface of the substrate.

However, since the array arranged with tips or polymer pens is very small in area, it is not easy to check leveling of the array with the surface of the substrate.

Studies of leveling an array arranged with tips or polymer pens with the surface of the substrate have been conducted and there has been disclosed a method that levels an array with the surface of the substrate at the angle where the largest force is applied, by measuring changes in force with changes in the angle of the array, using an apparatus that places a substrate to come in contact with an array on a balance and measures the force applied to the surface of the substrate at the moment of contacting (Patent Document 1).

Figure 1:
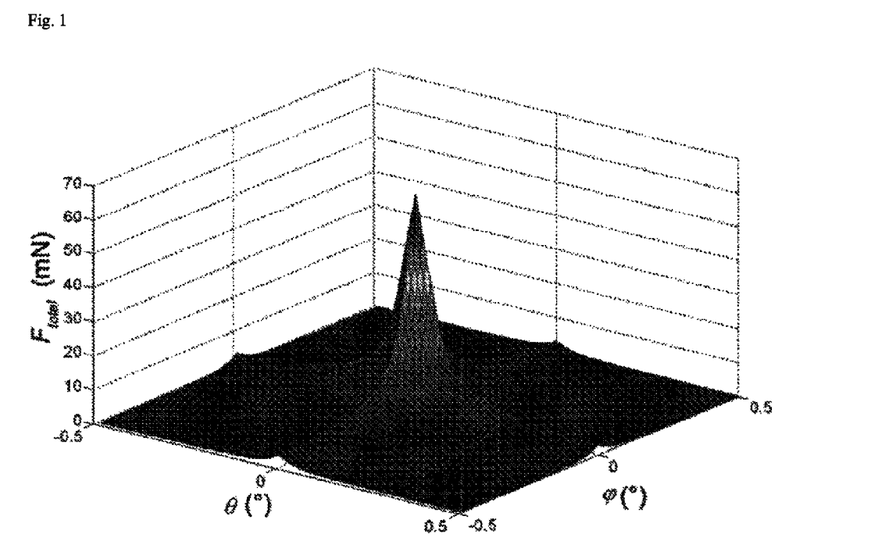
FIG. 1 is a graphs illustrating distribution of force measured by the apparatus disclosed in Patent Document 1.

FIG. 1 is a graph illustrating distribution of force measured by the apparatus disclosed in Patent Document 1 and it can be seen from FIG. 1 that the largest force is measured at the point where an array and the surface of a substrate are leveled, by repeating measurement of the force with changes in angle θ made by the array and X axis and the angle φ made by the array and Y axis.

However, the leveling method disclosed in Patent Document 1 requires many repeat tests to achieve the graph illustrated in FIG. 1, such that there is a problem in that a lot of time is taken, the array may be damaged during tests, and the cost increases due to reduction of lifespan of the array.

(Patent Document 1)
US Patent Publication No. US2011/0165329A1

SUMMARY OF THE INVENTION

The present invention has been made to solve the problems and an object of the present invention is to provide a leveling apparatus that can level an array arranged with tips or polymer pens with the surface of a substrate within short time by measuring force at three or more points with a plurality of force sensors.

The objects of the present invention are not limited to those described above and other objects may be made apparent to those skilled in the art from the following description.

According to an aspect of the present invention, there is provided a leveling apparatus that levels an object with a substrate such that one side of the object is brought in parallel contact with the surface of the substrate. The leveling apparatus includes: force sensors disposed to measure force at at least three points on the other side of the object; an angle adjusting unit disposed to adjust the angle between the object and the surface of the substrate; and a controller connecting with the force sensors and the angle adjusting unit to drive the angle adjusting unit on the basis of data from the force sensors. The controller obtains the data on force applied to the force sensors by bringing one side of the object in contact with the surface of the substrate at a predetermined angle, calculates the degree of relative inclination between the object and the surface of the substrate from the data on force, and levels the object with the surface of the substrate by adjusting the angle of the object or the substrate with the angle adjusting unit on the basis of the degree of relative inclination.

The controller calculates a coordinate of the average force on the basis of coordinates of the force sensors and the data on force applied to the force sensors and controls the angle adjusting unit such that the calculated coordinate of the average force become the same as a coordinate of the geometric center of the object.

The leveling apparatus further includes: a top case connected with an actuating stage; a printed circuit board where the force sensors are fixed; and a bottom case combined with the top case, and formed such that the printed circuit board is housed therein and the force sensors are exposed downward, in which the angle adjusting unit supports the substrate and adjusts the angle of the substrate.

The leveling apparatus further includes: a top case connected with an actuating stage; a printed circuit board where the force sensors are fixed; and a bottom case combined with the top case, and formed such that the printed circuit board is housed therein and the force sensors are exposed downward, in which the angle adjusting unit is disposed between the top case and the printed circuit board and adjusts the angle of the object.

The leveling apparatus further includes a magnet, in which the force sensors each have a contact portion exposed outside, the other side of the object is attached to a carrier made of a magnetic material in the shape of a plate, and the carrier is fixed in contact with the contact portions by the magnet.

The object is a polymer pen array with a plurality of pens arrayed on one side.

A plurality of cantilevers is arranged on one side of the object.

According to another aspect of the present invention, there is provided an atomic force microscope including the leveling apparatus.

According to a leveling apparatus and an atomic force microscope of the present invention, since it is possible to directly measure and adjust the angle between an object and a substrate, it is possible to reduce the time to level them and achieve automatic leveling.

The details of other exemplary embodiments are included in the following detailed description and the accompanying drawings.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements.

Although first, second, and the like are used in order to describe various components, the components are not limited by the terms. The above terms are used only to discriminate one component from the other component. Therefore, a first component mentioned below may be a second component within the technical spirit of the present invention.

The same reference numerals indicate the same elements throughout the specification.

In the drawings, size and thickness of each element are arbitrarily illustrated for convenience of description, and the present invention is not necessarily limited to those illustrated in the drawings.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or together executed through an association relationship.

A leveling apparatus according to an embodiment of the present invention and an atomic force microscope using the leveling apparatus will be described hereafter in detail with reference to the accompanying drawings.

Figure 2:
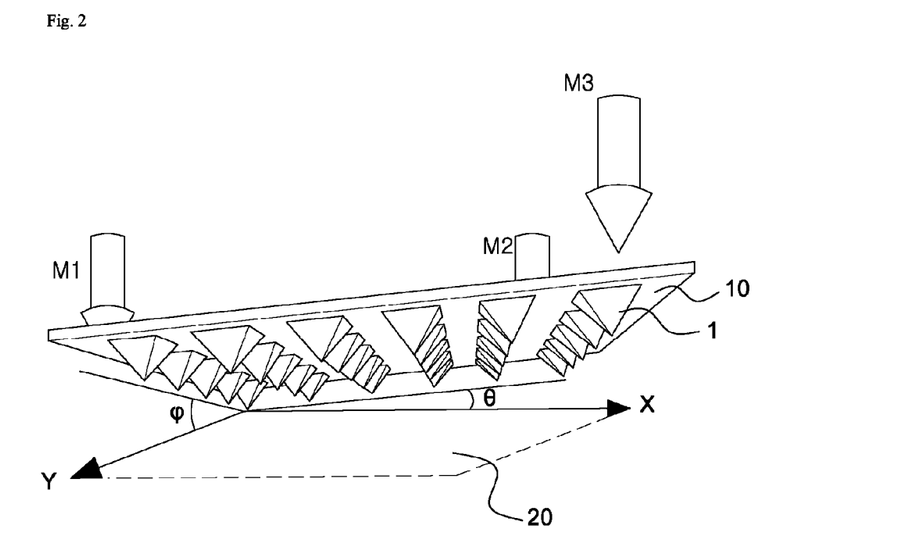
FIG. 2 is a schematic view illustrating a polymer pen array that is leveled by a leveling apparatus according to the present invention.
Figure 3:
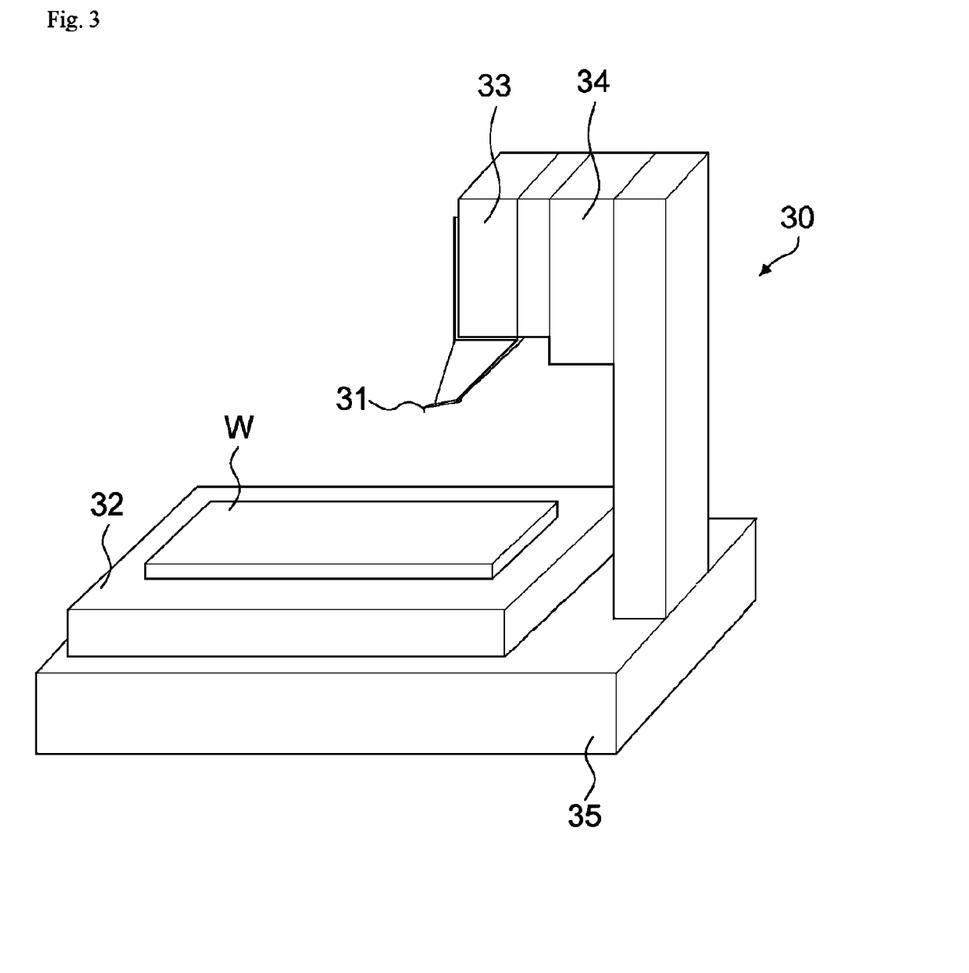
FIG. 3 is a schematic perspective view illustrating an atomic force microscope where an apparatus according to the present invention can be used.
Figure 4:
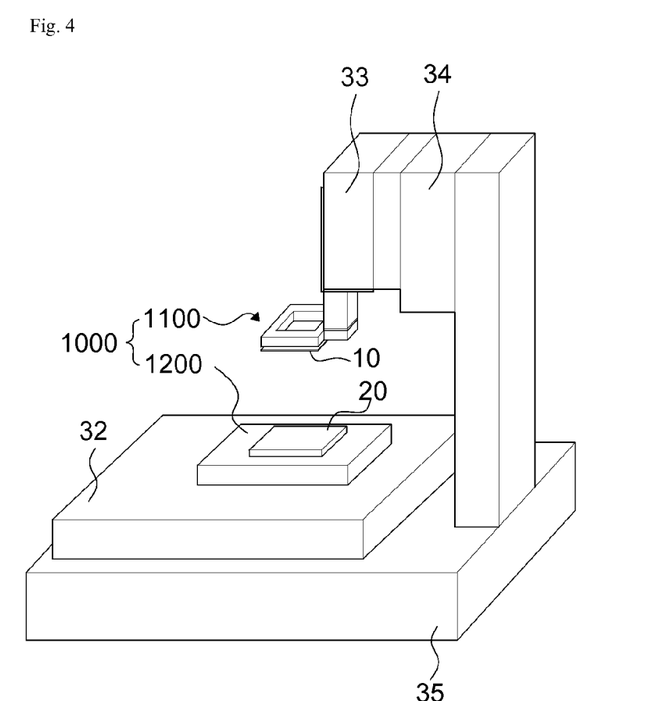
FIG. 4 is a schematic perspective view illustrating an atomic force microscope equipped with an apparatus according to the present invention.

FIG. 2 is a schematic view illustrating a polymer pen array that is leveled by a leveling apparatus according to the present invention, FIG. 3 is a schematic perspective view illustrating an atomic force microscope where an apparatus according to the present invention can be used, and FIG. 4 is a schematic perspective view illustrating an atomic force microscope equipped with an apparatus according to the present invention.

An object 10 of a leveling apparatus 1000 according to the present invention and an atomic force microscope 30 to which the leveling apparatus 1000 according to the present invention can be applied are described first with reference to FIGS. 2 to 4.

The leveling apparatus according to the present invention to be described hereafter, which is an apparatus that levels one side of an object in parallel contact with the surface of a substrate, can be usually used in dip-pen nanolithography and polymer pen lithography. For example, when a plurality of tips is formed to be arranged on one side of an object, the apparatus can be used in dip-pen nanolithography, and when a plurality of polymer pens are formed on one surface of an object, the apparatus can be used in polymer pen lithography. It is assumed that an object is a polymer pen array in the following description, but it is just for the convenience of description.

Referring to FIG. 2, an object corresponds to a polymer pen array 10 arranged with a plurality of pens 1 and the leveling apparatus is operated such that all of the pens 1 are simultaneously brought in contact with a substrate 20.

The polymer pen array 10 has a substantially flat plane shape, with the plurality of pens 1 arranged on one side and a flat surface on the other side. The pens 1 may be, for example, made of an elastomer and it is possible to put a substance such as ink or protein on the pens 1 and print the arrangement shape of the pens 1 on the substrate 20.

For uniform printing, it is preferable to bring the polymer pen array 10 in parallel contact with the substrate 20. That is, referring to FIG. 2, it is required to level the polymer pen array 10 such that the angle θ between the polymer pen array 10 and X axis of the substrate 20 and the angle φ between the polymer pen array 10 and Y axis of the substrate 20 are close to 0° respectively. The leveling apparatus according to the present invention levels an object such as the polymer pen array 10 with the substrate 20 by measuring force at three points M1, M2, and M3, as in FIG. 2, or more points.

The leveling apparatus according to the present invention can be mounted on an atomic force microscope (AFM) 30 illustrated in FIG. 3. Referring to FIG. 3, the atomic force microscope 30 includes a cantilever 31 following the surface of a scanning object W in contact or not in contact with it, an XY scanner 32 scanning the scanning object W in the X direction and Y direction on an XY plane, a Z scanner 33 connected with the cantilever 31 and moving the cantilever 31 relatively a little in the Z direction, a Z stage 34 moving the cantilever 31 and the Z scanner 33 relatively much in the Z direction, and a fixing frame 35 fixing the XY scanner 32 and the Z stage 34.

The atomic force microscope 30 obtains an image such as a topography by scanning the surface of the scanning object W with the cantilever 31. The relative movement between the surface of the scanning object W and the cantilever 31 can be made by the XY scanner 32 and the cantilever 31 can be moved up/down to follow the surface of the scanning object W by the Z scanner 33.

In the atomic force microscope 30 exemplified in FIG. 3, the XY scanner 32 two-dimensionally scans the scanning object and the Z scanner 33 is separated not to make correlation with the XY-scanning. However, it is not limited that the leveling apparatus according to the present invention is applied to an atomic force microscope 30 illustrated in FIG. 3 and the leveling apparatus may be used for well-known atomic force microscopes that perform XY-scanning and Z-scanning with single tube scanner. Further, the leveling apparatus according to the present invention can be used for apparatuses having a stage capable of moving up/down an object, in addition to the atomic force microscope 30, and the atomic force microscope 30 is only an example.

Referring to FIG. 4, the leveling apparatus 1000 according to an embodiment of the present invention includes a force measuring unit 1100 and an angle adjusting unit 1200. And, the leveling apparatus 1000 can be mounted on an atomic force microscope.

The force measuring unit 1100 is fixed to the Z scanner 33 and can be moved up/down by the Z scanner 33 and the Z stage 34. The object 10 (for example, a polymer pen array) is fixed under the force measuring unit 1100 and the force measuring unit 1100 measures force applied to the object 10 and transmits the obtained force data to a controller (not illustrated).

The angle adjusting unit 1200 that can adjust the relative angle between the substrate 20 and the force measuring unit 1100 is disposed on the Z scanner 33. A tilt stage may be used as the angle adjusting unit 1200 and the substrate 20 to be printed by the object 10 is placed on the angle adjusting unit 1200. The angle adjusting unit 1200 may be any device that can adjust the angles θ and φ illustrated in FIG. 2 and may be used for both of the automatic type and the manual type, but it is preferable to use an automatic tilt stage using a step motor for precise control.

The force measuring unit 1100 uses the Z stage 34 and the Z scanner 33 of the atomic force microscope 30 as actuating stages, where the Z stage 34 is in charge of relative long carrying and the Z scanner 33 is in charge of relatively short carrying.

Figure 5:
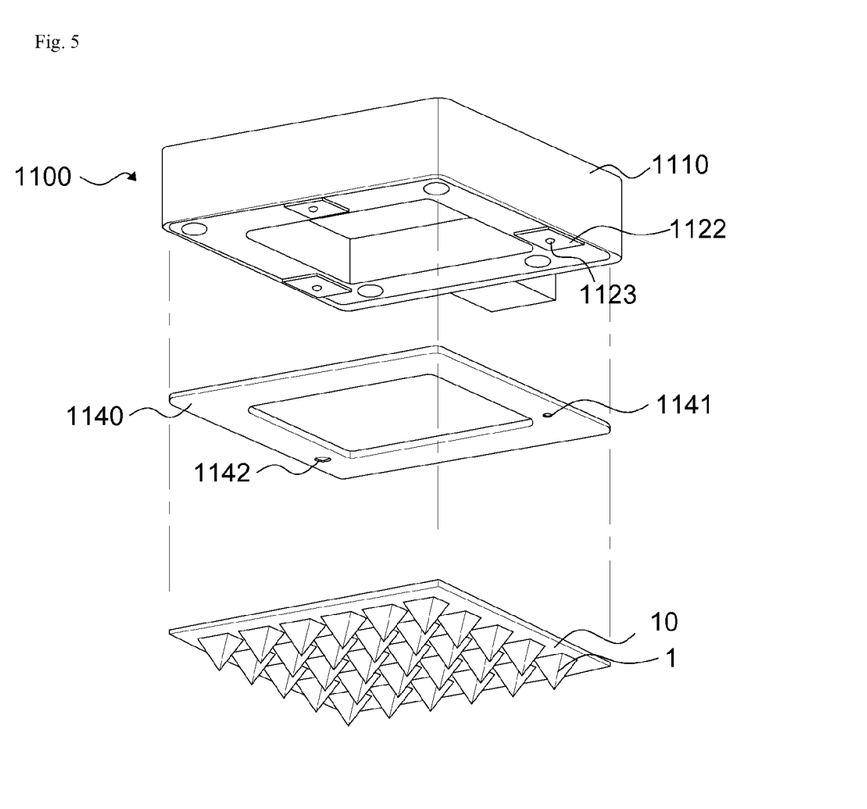
FIG. 5 is a schematic perspective view illustrating the force measuring unit illustrated in FIG. 4.
Figure 6:
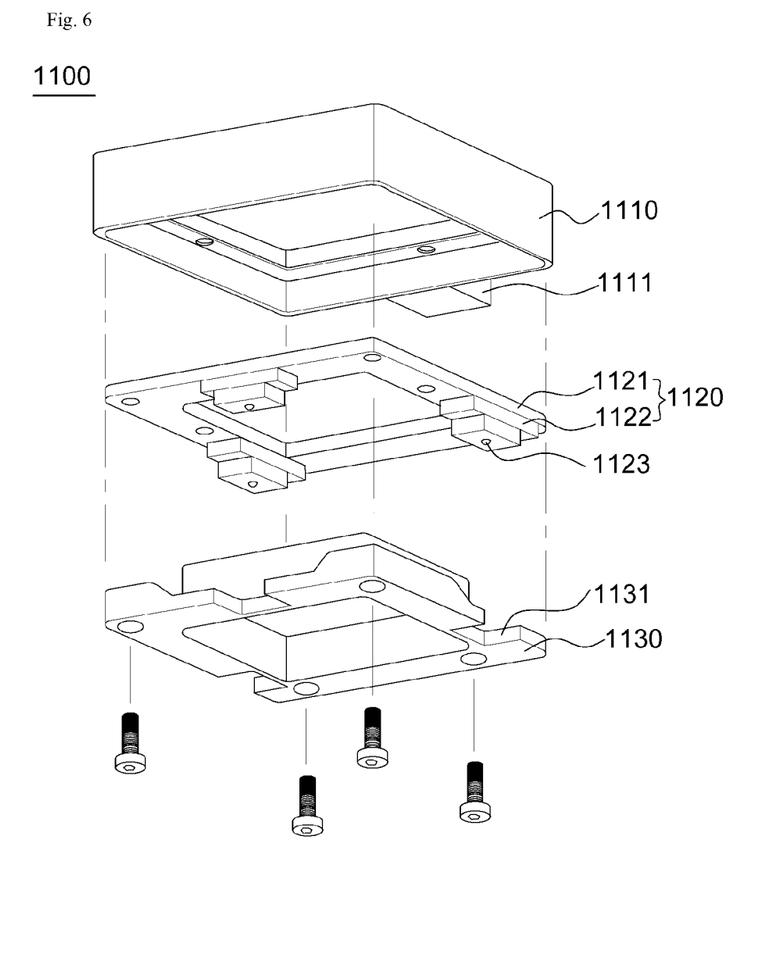
FIG. 6 is a schematic exploded perspective view illustrating the force measuring unit illustrated in FIG. 5.

FIG. 5 is a schematic perspective view of the force measuring unit 1100 illustrated in FIG. 4 and FIG. 6 is a schematic exploded perspective view of the force measuring unit 1100 illustrated in FIG. 5.

The detailed configuration of the force measuring unit 1100 is described with reference to FIGS. 5 and 6.

Referring to FIG. 6, the force measuring unit 1100 includes a top case 1110, a force sensing assembly 1120, and a bottom case 1130.

The top case 1110 has a connector 1111 fixed to the Z scanner 33 and an inner empty space to house the force sensing assembly 1120 to be described below.

The force sensing assembly 1120 is disposed inside the top case 1110 and includes a printed circuit board 1121 and at least three force sensors 1122 fixed to the printed circuit board 1121.

The force sensors 1122 each measure force that is applied to a metal ball 1123 on the outside. The printed circuit board 1121 supplies power to the force sensors 1122 and the data on force measured by the force sensors 1122 is sent to the controller (not illustrated) through the printed circuit board 1121. The printed circuit board 1121 is fixed to the top case 1110, for example, by bolts and the force sensors 1122 are exposed downward after the bottom case 1130 is combined, as in FIG. 5.

The bottom case 1130 protects the force sensing assembly 1120, covering it from lower side, and is fixed to the top case 1110 by bolts. Exposing holes 1131 are formed through the bottom case 1130 so that the force sensors 1122 can be exposed.

Further, a magnet (not illustrated) is fixed inside the bottom case 1130, not overlapping the force sensors 1122. For example, the magnet may be a permanent magnet and it fixes a carrier 1140 to the balls 1123 of the force sensors 1122 by applying an attractive force to the carrier 1140 to be described below.

Referring to FIG. 5, the force sensing assembly 1120 is protected from above and under by the top case 1110 and the bottom case 1130, with the force sensors 1122 exposed downward. A wire on the printed circuit board 1121 of the force sensing assembly 1120 can be connected to the controller through inside of the connector 1111 of the top case 1110.

Referring FIG. 5, the object 10 such as a polymer pen array can be fixed to the force measuring unit 1100 via the carrier 1140. The carrier 1140 is made of a magnetic material that can be attracted by a magnet and preferably has one circular hole 1141 and one oblong hole 1142 so that some of the balls 1123 of the force sensors 1122 can be inserted and seated therein.

The object 10 is attached to the bottom of the carrier 1140 by a double-sided tape or an adhesive, and the carrier 1140 is pulled and fixed by the magnet inside the force measuring unit 1100 and accordingly it can be fixed to the force measuring unit 1100. The object 10 is in contact with the balls 1123 of the force sensor 1122 at three points via the carrier 1140. Accordingly, when force is applied from lower side to the object 10, it is fully transmitted to the carrier 1140, so it can be measured by the force sensors 1122. It is possible to know distribution of force at at least three points by the force sensors 1122 and to calculate a coordinate of the average force from the distribution.

Figure 7:
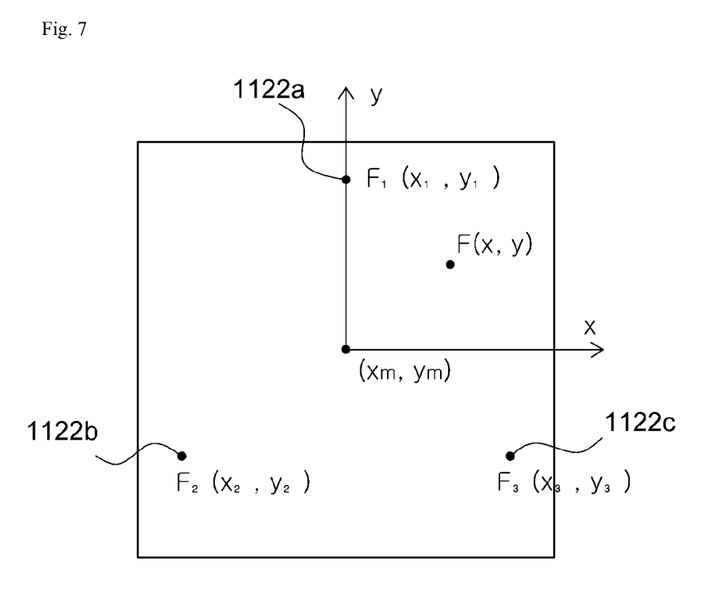
FIG. 7 is a view schematically illustrating arrangement of a force sensor of a force measuring unit with rectangular coordinates on a plane.

FIG. 7 is a view schematically illustrating arrangement of a force measuring unit and a force sensor with a rectangular coordinate on a plane.

A method of calculating the coordinate of an average force and a method of leveling the object 10 in parallel contact with the substrate 20, are described with reference to FIG. 7.

Under the assumption that, the coordinates of the first force sensor 1122a, the second force sensor 1122b, and the third force sensor 1122c are (x1, y1), (x2, y2), and (x3, y3), respectively, and the forces applied to the first force sensor 1122a, the second force sensor 1122b, and the third force sensor 1122c are F1, F2, and F3, respectively, in FIG. 7, a method of calculating an average force F and a position coordinate (x, y) equivalent to the actual force by F1, F2 and F3 is described.

It is assumed that the forces F1, F2, and F3 are applied perpendicular to the coordinate plane and the average force F is also applied perpendicular to the coordinate plane.

The following Equation 1 is obtained from the force equilibrium equation under the assumptions.

$$F_1 + F_2 + F_3 = F \quad \text{[Equation 1]}$$

The following Equation 2 can be obtained from the moment equilibrium equation.

$$F_1 x_1 + F_2 x_2 + F_3 x_3 = Fx$$

$$F_1 y_1 + F_2 y_2 + F_3 y_3 = Fy \quad \text{[Equation 2]}$$

The following Equation 3 can be obtained from Equation 1 and Equation 2 in matrix.

$$\begin{pmatrix} a & a & a \\ x_1 & x_2 & x_3 \\ y_1 & y_2 & y_3 \end{pmatrix} \begin{pmatrix} F_1 \\ F_2 \\ F_3 \end{pmatrix} = \begin{pmatrix} Fa \\ Fx \\ Fy \end{pmatrix} \quad \text{[Equation 3]}$$

Assuming that f1, f2, and f3 are obtained by dividing F1, F2, and F3 into F respectively, Equation 3 can become the following Equation 4.

$$\begin{pmatrix} a & a & a \\ x_1 & x_2 & x_3 \\ y_1 & y_2 & y_3 \end{pmatrix} \begin{pmatrix} f_1 \\ f_2 \\ f_3 \end{pmatrix} = \begin{pmatrix} a \\ x \\ y \end{pmatrix} \quad \text{[Equation 4]}$$

The coordinate (x, y) where the average force is applied can be obtained from Equation 4. This is because the coordinates of the first force sensor 1122a to the third sensor 1122c were already determined and the forces at the coordinates can be measured by the first force sensor 1122a to the third force sensor 1122c.

If the object is brought in contact with the substrate 20 at an inclined angle, larger force is applied around the earlier contact portion, so the coordinate of the average force is moved closer to the earlier contact portion. In contrast, when almost the entire surface (for example, all of the polymer pen of a polymer pen array) is brought in contact with the substrate 20 with the object 10 parallel with the substrate 20, the coordinate of the average force would be a coordinate $(x_m, y_m)$ of the geometrical center of the object 10 (or geometrical center of the points 1122a to 1122c).

The further coordinate (x, y) of the average force calculated from Equation 4 is from the coordinate $(x_m, y_m)$ of the geometrical center of the object 10, the more the object 10 would be considered as being inclined with respect to the substrate 20.

Accordingly, it is possible to level the object 10 with the substrate 20 by correcting the coordinate (x, y) of the calculated average force into the coordinate $(x_m, y_m)$ of the geometrical center of the object 10. The correction can be achieved by adjusting the relative angle between the force measuring unit 1100 and the angle adjusting unit 1200, and by inclining the substrate 20 with the angle adjusting unit 1200 in the embodiment illustrated in FIGS. 4 to 6.

The controller can calculate the coordinates of the average force and adjust the angle. The angle adjustment may be achieved by converting the coordinates of the measured and calculated average force into an x-axial turning value and a y-axial turning value to be adjusted in accordance with a predetermined conversion table, or it may be achieved by adjusting in real time the coordinates of the average force to the coordinates of the geometrical center of the object 10 by performing closed loop feedback in real time. Alternatively, the angle adjustment may be achieved by using a conversion equation that is obtained in advance instead of the conversion table described above.

Feedback of adjusting the angle in real time is suitable for accurate leveling even with the object 10 in contact with the substrate 20 and it allows for leveling within short time. In detail, when some of the pens of a polymer pen array that is the object 10 are brought in contact with the substrate 20, leveling is continued while the non-contact portions are brought in contact without the contact pens taken off, such that it is possible to reduce the time taken for leveling, as compared with a trial and error method that is a kind of method of bringing the contact pens in contact after taking them off and correcting errors. Further, even when the leveling is broken during a contact state, for example, due to thermal expansion of the equipment, it can be adjusted in real time, so it is preferable.

Figure 8:
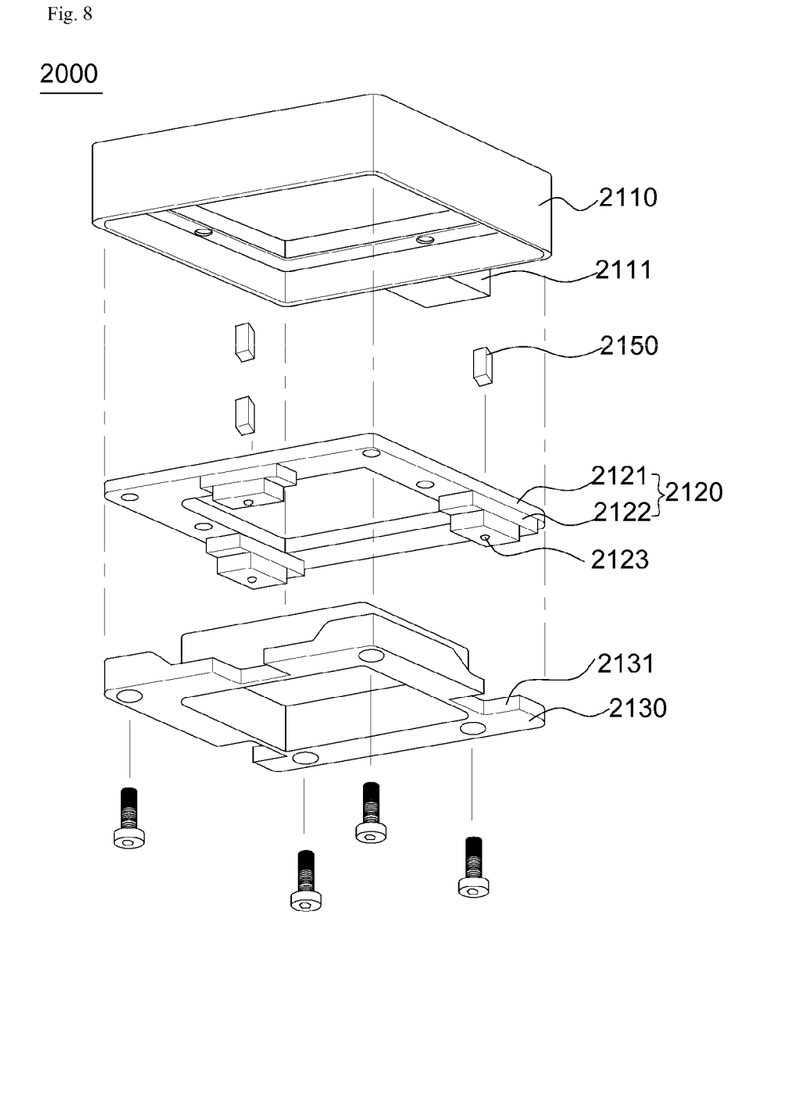
FIG. 8 is a schematic perspective view illustrating a leveling apparatus according to another embodiment of the present invention.

FIG. 8 is a schematic perspective view illustrating a leveling apparatus according to another embodiment of the present invention.

A leveling apparatus 2000 according to another embodiment of the present invention is described with reference to FIG. 8. In the configuration of the leveling apparatus 2000 according to this embodiment, the force measuring unit 1100 and the angle adjusting unit 1200 of the leveling apparatus 1000 illustrated in FIGS. 4 to 6 are integrated.

Referring to FIG. 8, the leveling apparatus 2000 of this embodiment includes a top case 2110, an angle adjusting unit 2150, a force sensing assembly 2120, and a bottom case 2130. Since the top case 2110, force sensing assembly 2120, and bottom case 2130 are the same of the top case 1110, force sensing assembly 1120, and bottom case 1130 of the leveling apparatus 1000 described above, the detail description is not provided and only the differences are described.

In the leveling apparatus 2000 of this embodiment, the angle adjusting unit 2150 is disposed between the top case 2110 and the force sensing assembly 2120. The angle adjusting unit 2150 makes it possible to adjust the angle of the force sensing assembly 2120 to the top case 2110.

In this embodiment, the angle adjusting unit 2150 is implemented by a plurality of piezo actuators. As shown in FIG. 8, the piezo actuators are disposed above the force sensors 2112, respectively, such that the angles between the force sensors 2112 can be adjusted. Unlike FIG. 8, it may be possible to adjust the angle with two piezo actuators by providing a piezo actuator for each of two force sensors 2112 and enable the other one force sensor 2112 to pivot.

Other than the piezo actuators, the angle adjusting unit 2150 may be implemented by a tilting stage and all other configurations that can adjust an angle can be used.

The leveling apparatus 2000 according to this embodiment can operate in the same way of the leveling apparatus 1000 illustrated in FIGS. 4 to 6, but is different in that the angle adjustment is made by inclining the object 10. The others are the same as those described above and the detailed description is not provided.

According to the leveling apparatuses 1000 and 2000 of the present invention, since it is possible to level the object 10 with the substrate 20 after one contact or at a time in real time, it is possible to considerably reduce the time to level them. Further, it is possible to prevent damage to the object 10 due to repeated trials and errors in leveling. Accordingly, improvement of productivity can be expected particularly in dip-pen nanolithography and polymer pen lithography.

Although embodiments of the present invention were described above with reference to the accompanying drawings, those skilled in the art would understand that the present invention may be implemented in various ways without changing the necessary features or the spirit of the prevent invention. Therefore, the embodiments described above are only examples and should not be construed as being limitative in all respects.

For example, although three force sensors 1122 and 2122 are used in the embodiments, respectively, four or more force sensors may be used. In this case, it is also possible to level them by calculating the coordinate of the average force in the same way of the embodiments.

Further, although it was described in the above that a magnet may be disposed inside the bottom case 2130, a magnet may be disposed outside the bottom case 2130 and exposed downward.

What is claimed is:

1. A leveling apparatus that levels an object with a substrate such that one side of the object is brought in parallel contact with a surface of the substrate, the leveling apparatus comprising:
    force sensors disposed to measure force at at least three points on a side of the object not in contact with the surface of the substrate;
    an angle adjusting unit disposed to adjust a relative angle between the object and the surface of the substrate; and
    a controller connecting with the force sensors and the angle adjusting unit to drive the angle adjusting unit on the basis of data from the force sensors,
    wherein the controller obtains the data on force applied to each of the force sensors by bringing one side of the object in contact with the surface of the substrate at a predetermined angle, calculates a degree of relative inclination between the object and the surface of the substrate from the data on force, and levels the object with the surface of the substrate by adjusting the angle of the object or the substrate with the angle adjusting unit on the basis of the degree of relative inclination, and
    wherein the controller calculates a coordinate of an average force on the basis of the coordinates of the force sensors and the data on force applied to the force sensors and controls the angle adjusting unit such that the calculated coordinate of the average force becomes the same as a pre-determined coordinate.

2. The leveling apparatus according to claim 1, wherein the pre-determined coordinate is a coordinate of a geometrical center of the object.

3. The leveling apparatus according to claim 1 further comprising:
    a top case connected with an actuating stage;
    a printed circuit board where the force sensors are fixed; and
    a bottom case combined with the top case, and formed such that the printed circuit board is housed therein and the force sensors are exposed downward,
    wherein the angle adjusting unit supports the substrate and adjusts the angle of the substrate.

4. The leveling apparatus according to claim 1 further comprising:
    a top case connected with an actuating stage;
    a printed circuit board where the force sensors are fixed; and
    a bottom case combined with the top case, and formed such that the printed circuit board is housed therein and the force sensors are exposed downward,
    wherein the angle adjusting unit is disposed between the top case and the printed circuit board and adjusts the angle of the object.

5. The leveling apparatus according to claim 1 further comprising a magnet,
    wherein the force sensors each have a contact portion exposed outside,
    the other side of the object is attached to a carrier made of a magnetic material in the shape of a plate, and
    the carrier is fixed in contact with the contact portions by the magnet.

6. The leveling apparatus according to claim 1, wherein the object is a polymer pen array with a plurality of pens arrayed on one side.

7. The leveling apparatus of claim 1, wherein a plurality of cantilevers is arranged on one side of the object.

8. An atomic force microscope comprising the leveling apparatus according to the claim 1.

* * * * *